(12) United States Patent
Bristol et al.

(10) Patent No.: US 9,285,682 B2
(45) Date of Patent: Mar. 15, 2016

(54) PRE-PATTERNED HARD MASK FOR ULTRAFAST LITHOGRAPHIC IMAGING

(71) Applicant: Intel Corporation, Santa Clara, CA (US)

(72) Inventors: Robert L. Bristol, Portland, OR (US); Paul A. Nyhus, Portland, OR (US); Charles H. Wallace, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/642,328

(22) Filed: Mar. 9, 2015

(65) Prior Publication Data

US 2015/0253667 A1    Sep. 10, 2015

Related U.S. Application Data

(63) Continuation of application No. 13/834,059, filed on Mar. 15, 2013, now Pat. No. 9,005,875.

(51) Int. Cl.

| | |
|---|---|
| G03F 7/095 | (2006.01) |
| G03F 7/00 | (2006.01) |
| G03F 7/20 | (2006.01) |
| G03F 7/004 | (2006.01) |
| G03F 7/09 | (2006.01) |
| G03F 7/38 | (2006.01) |
| H01L 21/027 | (2006.01) |
| H01L 21/033 | (2006.01) |

(52) U.S. Cl.
CPC .............. *G03F 7/095* (2013.01); *G03F 7/0002* (2013.01); *G03F 7/0035* (2013.01); *G03F 7/0043* (2013.01); *G03F 7/0045* (2013.01); *G03F 7/094* (2013.01); *G03F 7/2037* (2013.01); *G03F 7/2039* (2013.01); *G03F 7/2041* (2013.01); *G03F 7/38* (2013.01); *H01L 21/0274* (2013.01); *H01L 21/0334* (2013.01); *Y10S 430/143* (2013.01); *Y10S 430/168* (2013.01); *Y10T 428/24851* (2015.01)

(58) Field of Classification Search
CPC ..... G03F 7/095; G03F 7/0035; G03F 7/2037; G03F 7/2039; G03F 7/0002; G03F 7/0043; G03F 7/0045; G03F 7/094; G03F 7/2041; G03F 7/38; H01L 21/0274; H01L 21/0334; Y10S 428/24851; Y10S 430/143; Y10S 430/168

USPC ....................................................... 430/271.1
See application file for complete search history.

(56) References Cited

U.S. PATENT DOCUMENTS

| | | | |
|---|---|---|---|
| 2010/0294740 A1 | 11/2010 | Cheng et al. | |
| 2013/0164456 A1 | 6/2013 | Winter et al. | |
| 2014/0091476 A1 | 4/2014 | Nyhus et al. | |

OTHER PUBLICATIONS

Dai, et al., "Synthesis and Evaluation of Novel Organoelement Resists for EUV Lithography", Advances in Resist Technology and Processing XX, 2003, pp. 1164-1172, Proceedings of SPIE vol. 5039, Theodore H. Fedynyshyn, Editor.

Chung, Gwiy-Sang, "Anisotropic Etching Characteristics of Si in Tetramethylammonium Hydroxide: Isopropyl Alcohol: Pyrazine Solutions", School of Electronic Engineering, University of Ulsan, Ulsan, Dec. 3, 2004, pp. 1152-1156.

Gallatin, Greg M., "Resist Blur and Line Edge Roughness", IBM T.J. Watson Research Center, 2005, pp. 38-52, Yorktown Heights, NY, proceedings of SPIE vol. 5754 (2005).

Hermans, et al., "Progress in EUV Lithography Towards Manufacturing from an Exposure Tool Perspective", Extreme Ultraviolet (EUV) Lithography III, Proc of SPIE vol. 8322,832202, 2012, 13 pages.

van Veenhuizen, et al., "Demonstration of an electrically functional 34nm metal pitch interconnect in ultralow-k ILD using spacer-based pitch quartering", Components Research, Intel Corporation, 2012 IEEE, 3 pages.

Knisley et al., "Volatility and High Thermal Stability in Mid-to-Late First-Row-Transition-Metal Diazadienyl Complexes", Department of Chemistry, Wayne State University, Detroit, Michigan, Aug. 25, 2011, pp. 5009-5017.

*Primary Examiner* — Christopher Young
(74) *Attorney, Agent, or Firm* — Grossman, Tucker, Perreault & Pfleger, PLLC

(57) ABSTRACT

A method of fabricating a substrate including coating a first resist onto a hardmask, exposing regions of the first resist to electromagnetic radiation at a dose of 10.0 mJ/cm² or greater and removing a portion of said the and forming guiding features. The method also includes etching the hardmask to form isolating features in the hardmask, applying a second resist within the isolating features forming regions of the second resist in the hardmask, and exposing regions of the second resist to electromagnetic radiation having a dose of less than 10.0 mJ/cm² and forming elements.

20 Claims, 8 Drawing Sheets

PRE-PATTERNED HARD MASK FOR ULTRAFAST LITHOGRAPHIC IMAGING

REFERENCE TO PRIORITY APPLICATION

This application is a Continuation of U.S. patent application Ser. No. 13/834,059 filed Mar. 15, 2013, which is incorporated herein by reference in its entirety,

FIELD

The present disclosure relates to a method of using pre-patterned hard masks for lithographic imaging.

BACKGROUND

A common method of forming structures on wafers or other substrates in the semiconductor industry is lithography and, in particular photolithography. In photolithography, features are formed by the addition or removal of material on a substrate surface. Perceived limitations in photolithography, including the optical diffraction limit, spurred the development next-generation lithography techniques, such as extreme ultraviolet lithography (EUV), soft x-ray lithography and electron beam lithography (EBL). However, limitations in next generation lithography techniques, (including low wafer throughput and resolution limits due to stochastic effects, acid diffusion and other factors), have negatively impacted the commercial implementation of next generation techniques for wide scale wafer production. In addition, photolithography capabilities have been extended to provide lower critical dimensions through process modifications, including immersion and multiple patterning techniques, and advances in material chemistry.

BRIEF DESCRIPTION

The above-mentioned and other features of this disclosure, and the manner of attaining them, may become more apparent and better understood by reference to the following description of embodiments described herein taken in conjunction with the accompanying drawings, wherein:

FIGS. 2a through 2t illustrate a schematic of a method of forming elements in or on a substrate according to one embodiment wherein FIGS. 2a and 2b illustrate a cross-sectional view and a top view, respectively, of a substrate including a sacrificial hardmask and a resist disposed over the hardmask prior to forming guiding features therein;

FIGS. 2s and 2t illustrate a cross-sectional view and a top view, respectively of a third resist forming elements on a substrate.

FIGS. 4a through 4l illustrate another method of forming elements in or on a substrate according to an embodiment wherein FIGS. 4a and 4b illustrate a cross-sectional view and a top view, respectively, of a substrate including a sacrificial hardmask and a resist disposed over the hardmask having guiding features formed in the hardmask;

FIGS. 4c and 4d illustrate a cross-sectional view and a top view, respectively, of isolating features formed in a hardmask;

FIGS. 4e and 4f illustrate a cross-sectional view and a top view, respectively, of a the guiding feature materials removed;

FIGS. 4g and 4h illustrate a cross-sectional view and a top view, respectively, of a second resist disposed in the isolating features;

FIGS. 4i and 4j illustrate a cross-sectional view and a top view, respectively, of the removal of a portion of the resist; and FIGS. 4k and 4l illustrate a cross-sectional view and a top view, respectively, of elements formed within the substrate.

DETAILED DESCRIPTION

As noted above, limitations in next generation lithography techniques, including e-beam lithography, extreme ultraviolet lithography and soft x-ray lithography, include relatively low throughput rate and exposure noise. Generally there is understood to be a trade-off between imaging fidelity and photospeed. Next generation schemes, such as extreme ultra-violet, provide photospeeds of about 10 mJ/cm$^2$ with a throughput of about only 4 wafers per hour. However, next generation techniques are capable of providing irregular, or non-regular features, i.e., features that do not repeat at fixed intervals. Photolithography practices provide wafer throughput above 100 wafers per hour and upwards of 150 wafers per hour. Furthermore, photolithography is capable of generating repeating patterns (especially line-spaced grating structures) at pitches of 34 nm and below using, for example, 193 nm scanners and spacer-based pitch division.

Figure 1:
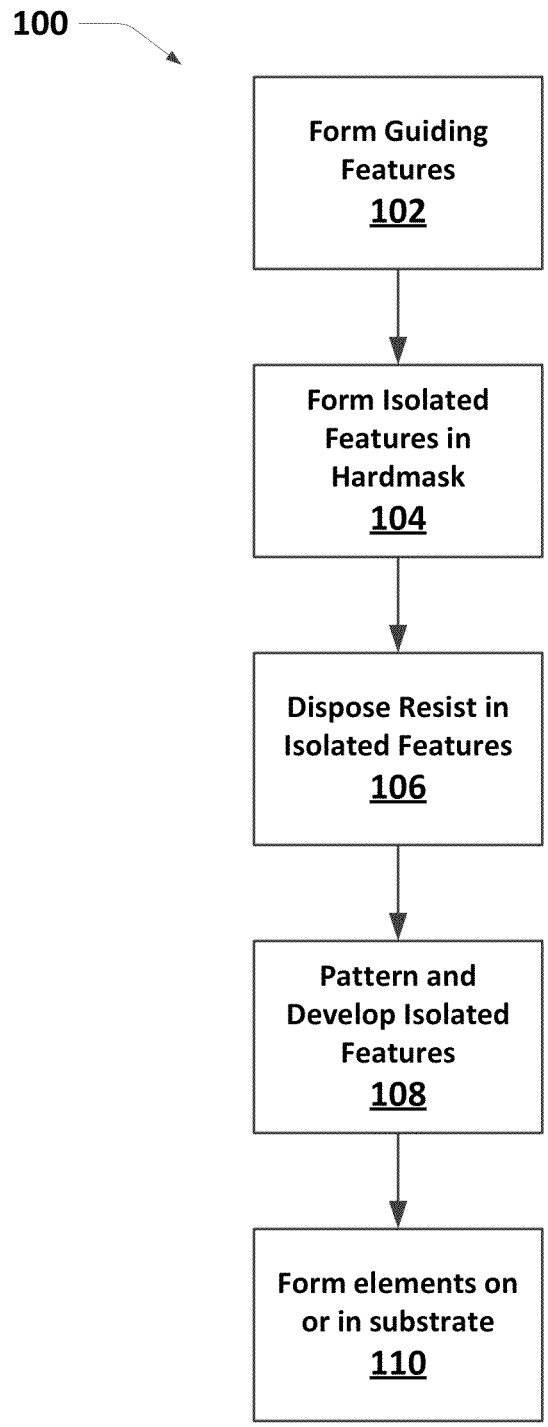
FIG. 1 illustrates a flow chart of a general method of forming elements on a substrate.

The present disclosure is directed to methods and processes of fabricating substrates including forming elements, such as vias or contacts, in or forming elements on a substrate, which includes, for example, a semi-conductor wafer. As illustrated in FIG. 1, the methods 100 include forming guiding features in a photoresist or a sacrificial mask 102. The guiding features may be formed using photolithography. Using the guiding features, isolated features are then formed in a hardmask 104. The isolated features are then filled with a resist creating discrete regions (photon or electron "buckets") of the resist in the hardmask 106. Then the discrete regions of resist are patterned and developed in an isolated manner 108, wherein the hardmask may prevent or reduce noise between the isolated regions of resist. The resist includes positive resists, negative resists or both. Regular or irregular patterning of the resist may be performed using photolithography using wavelengths of 157 nm or greater, extreme ultraviolet lithography (EUV), electron beam lithography (EBL), soft x-ray lithography, or other techniques, to form elements (such as vias) in a substrate or elements (such as interconnects) on the substrate. Elements such as vias, interconnects, or contacts, may then be formed on or in the substrate underlying the hardmask 110. In embodiments, the hardmask remains, providing an inter-layer dielectric or may be removed.

In embodiments, the isolating features exhibit critical dimensions in the range of 4 nm to 100 nm, including all values and ranges therein such as 4 nm to 50 nm, 4 nm to 20 nm, 4 nm to 10 nm, etc., and are regular repeating patterns, such as line-space gratings, crossed-line gratings, or other patterns. In embodiments, the elements created by the methods herein also have critical dimensions in the range of 4 nm to 100 nm, including all values and ranges therein such as 4 nm to 50 nm, 4 nm to 20 nm, 4 nm to 10 nm, etc., and are regular features, non-regular features, or both, including irregularly placed holes and posts. While not being bound to any particular theory, the isolating features may constrain shot noise, secondary electrons, photoelectrons, etc., creating photon or electron "buckets", reducing the spread of such noise in the isolated regions of resist deposited therein. Furthermore, in embodiments, the resist, used in the isolating feature, is selected such that it is pattered using electromagnetic wavelengths of less than 50 nm, such as in the range of 1 pm to 50 nm. In addition, the resist, used in the isolating features, is activated with relatively low exposure doses of electromagnetic radiation (less than 10.0 mJ/cm$^2$, such as from 0.1 mJ/cm$^2$ up to 10.0 mJ/cm$^2$, such as 3.0 mJ/cm$^2$) or electrons of equivalent dosage (100 µC/cm$^2$ or less, such as from 1.0 µC/cm$^2$ to 100 µC/cm$^2$). Thus, the resist includes, in embodiments, a photoresist, a soft x-ray resist or an electron beam resist. The process results in relatively high throughput rates, while fabricating relatively small scale features on the order of 4 nm to 100 nm, including all values and ranges therein such as 4 nm to 50 nm, 4 nm to 20 nm, 4 nm to 10 nm, etc.

Figure 2A:
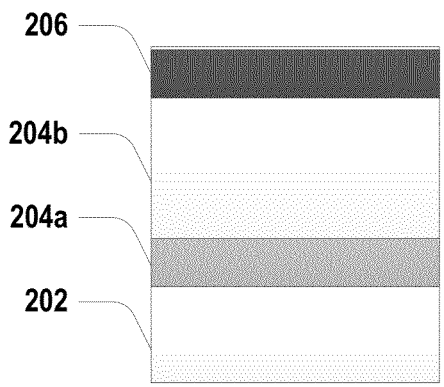
Figure 2B:
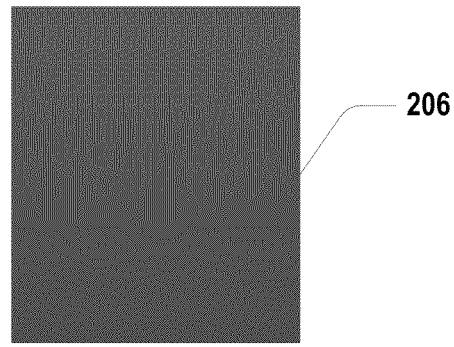
Figure 2C:
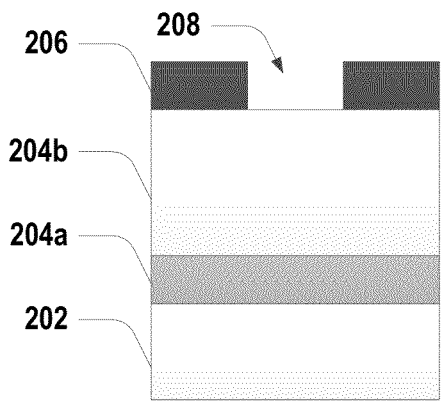
FIGS. 2c and 2d illustrate a cross-sectional view and a top view, respectively, of a patterned and developed resist over the sacrificial hardmask.
Figure 2D:
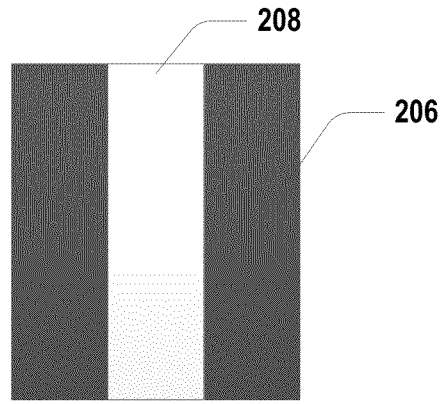
Figure 2E:
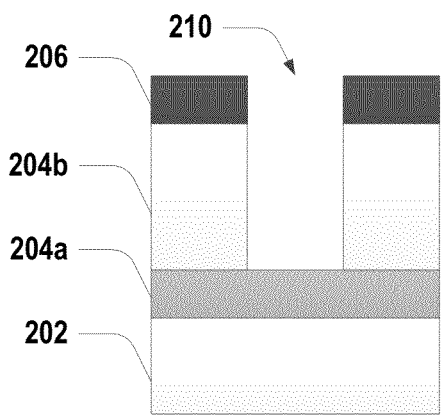
FIGS. 2e and 2f illustrate a cross-sectional view and a top view, respectively, of a guiding feature provided within a sacrificial hardmask.
Figure 2F:
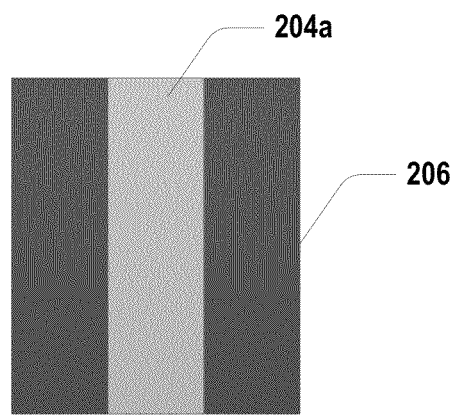
Figure 2G:
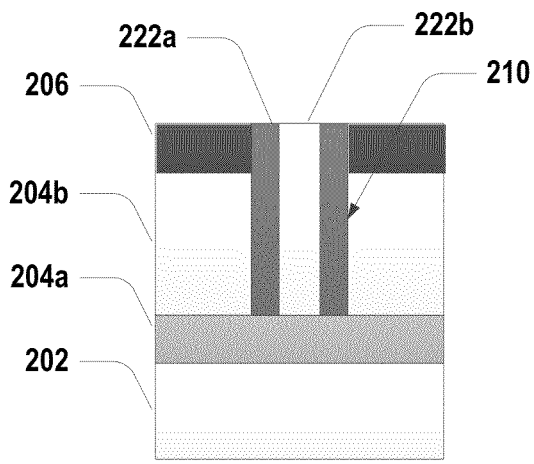
FIGS. 2g and 2h illustrate a cross-sectional view and a top view, respectively, of a self-assembling block copolymer provided within the guiding feature of the sacrificial hardmask.
Figure 2H:
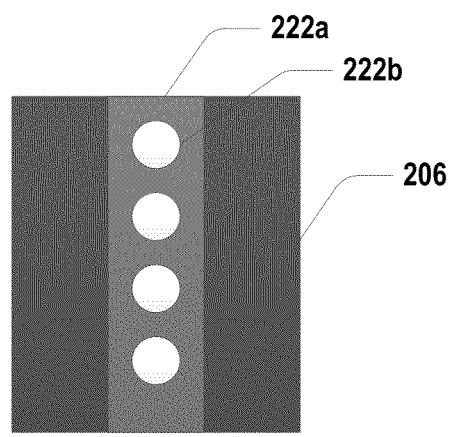
Figure 2I:
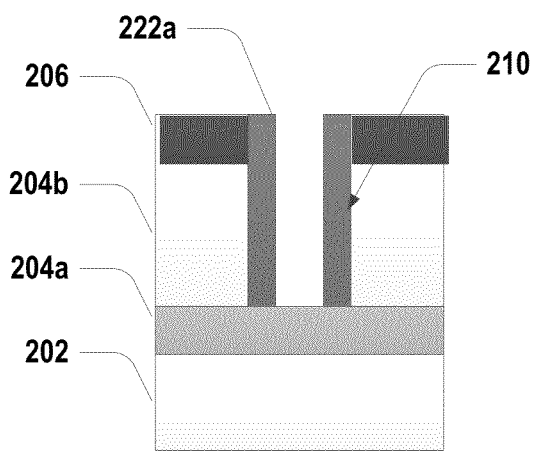
FIGS. 2i and 2j illustrate a cross-sectional view and a top view, respectively, of the removal of a domain of the self-assembled block copolymer within the guiding feature.
Figure 2J:
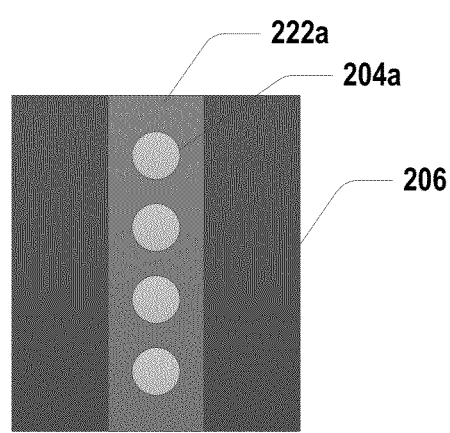
Figure 2K:
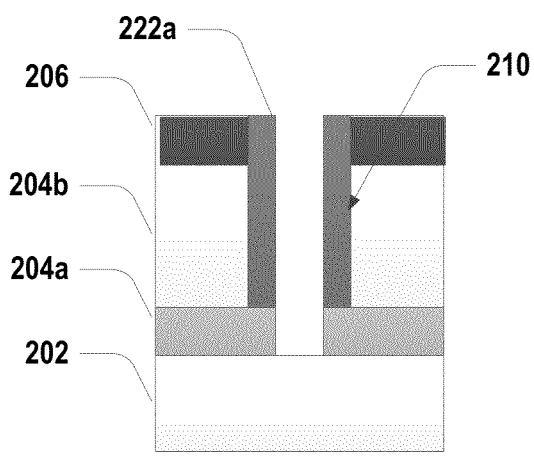
FIGS. 2k and 2l illustrate a cross-sectional view and a top view, respectively, of a isolating feature formed in a lower layer of a hardmask.
Figure 2L:
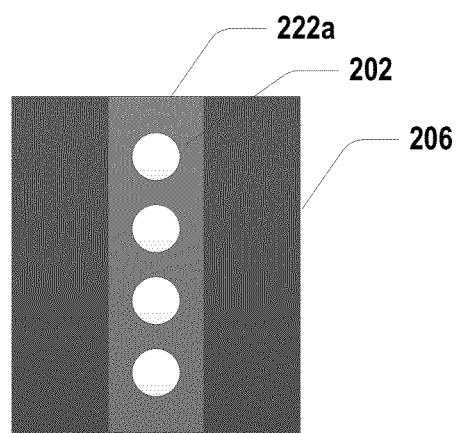
Figure 2M:
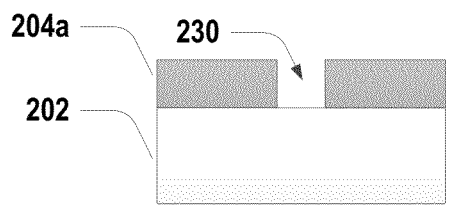
FIGS. 2m and 2n illustrate a cross-sectional view and a top view, respectively, of a isolating feature formed in a hardmask after the removal of the materials forming the guiding features.
Figure 2N:
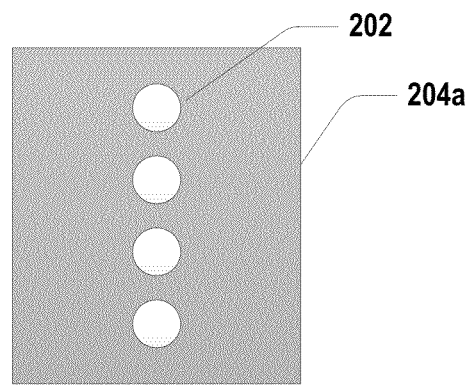
Figure 2O:
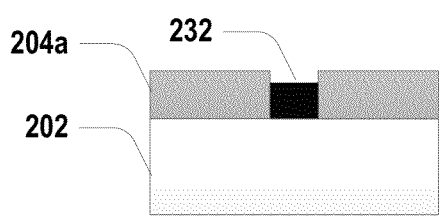
FIGS. 2o and 2p illustrate a cross-sectional view and a top view, respectively, of a third resist provided in the isolating features of the hardmask.
Figure 2P:
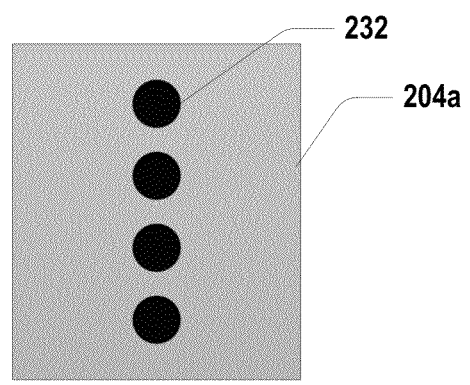
Figure 2Q:
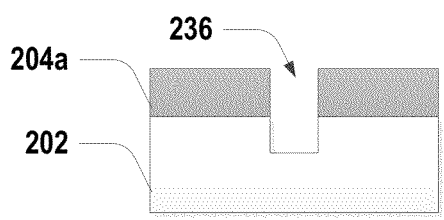
FIGS. 2q and 2r illustrate a cross-sectional view and a top view, respectively, of a third resist forming elements in the substrate.
Figure 2R:
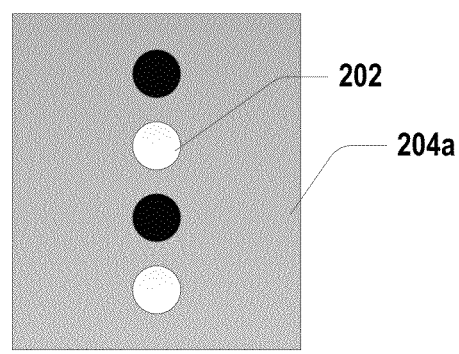
Figure 2S:
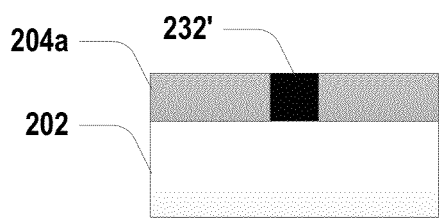
Figure 2T:
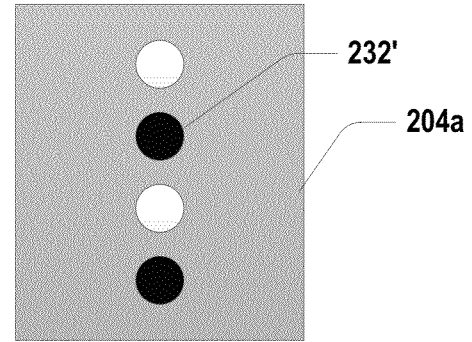

FIGS. 2a through 2t schematically illustrate an embodiment of a method of forming elements into (or onto a substrate). The method begins with forming a guiding trench in one or more layers of a hardmask 204a, 204b formed over a substrate 202. Hardmask compositions may include, for example, nitrides (such as TiN, SiN), oxides (such as SiO$_2$), or polymer spin coats (such as spin on carbon) as well as photodefinable polymers (such as photodefinable polyimides, photodefinable benzocyclobutene, photodefinable fluorocarbons polymers and photodefinable epoxies) or combinations thereof. Depending on the hardmask composition, the hardmask may be applied by spin coating or other processes such as physical vapor deposition or chemical vapor deposition, plasma enhanced variants thereof (PEPVD or PECVD) as well as combinations thereof (i.e., one or more of the following: spin-coating, CVD, PVD, PEPVD and PECVD).

In embodiments, the hardmask includes two layers, a lower, underlying layer 204a and an upper, sacrificial layer, 204b. The bottom layer of the hardmask 204a (that closest to the substrate 202) may include nitrides such as TiN, SiN, oxides such as SiO$_2$ or other compositions that exhibit greater etch resistance than the etch resistance of the sacrificial hardmask layer 204b to a selected etchant.

Anti-reflective coatings may optionally be provided as well. Antireflection coatings aid in the reduction of image distortion due to reflections off of the surface of the substrate. The anti-reflective coating may be added over the sacrificial hardmask 204b (opposing the substrate), such as silicon-rich or silicon containing anti-reflective coatings (including, for example, silicon oxynitride or silicon rich nitride), which may reduce reflective notching in the side walls and reduce the quality of the patterned features.

A first resist 206 (or one or more first resists) is disposed over the sacrificial hardmask 204b. The first resist is a positive resist or a negative resist and may include for example, poly (methyl methacrylate), poly(methyl glutarimide), DNQ/novolac, or SU-8 (an epoxy based negative resist). The first resist 206 is applied using one or more coating or casting processes, such as, but not limited to, spin coating. When using spin coating, spin coating may be performed at 1 to 10,000 rpm, including all values and ranges therein such as 3,000 to 4,000 rpm, for 1 second to 10 seconds, including all values and ranges therein.

Multiple baking steps are used to solidify the first resist 206 beginning with pre-baking after application of the resist and prior to patterning. Pre-bake may occur at temperatures of 140° C. or less, such as in the range of 70° C. to 100° C., for 60 seconds to 240 seconds. The resist is then patterned using electromagnetic radiation having one or more wavelengths of 157 nm or greater, such as 157 nm, 193 nm, 248 nm, or wavelengths up to 436 nm. The electromagnetic radiation dosage is 10 mJ/cm$^2$ or greater, including all values and ranges from 10 mJ/cm$^2$ to 200 mJ/cm$^2$, 10 mJ/cm$^2$ to 150 mJ/cm$^2$, 30 mJ/cm$^2$ to 100 mJ/cm$^2$, etc. Spacer-based pitch division techniques may be utilized alone, or with immersion lithography techniques, to achieve guiding features (trenches in this embodiment) having critical dimensions of 4 nm to 100 nm, 22 nm to 50 nm, etc. Spacer-based pitch division techniques may be understood as a multiple patterning technique where a pattern (such as lines) is formed. A spacer is formed by the deposition or formation of a film on the previous formed pattern. The film material on the horizontal surfaces is then etched off and the original pattern feature is removed leaving only the spacer. This may be repeated, wherein the spacer then forms the pattern, doubling the density each repetition. Immersion lithography enhances the resolution of photolithography by utilizing a liquid interface between the lens of the light emitter of the photolithography device and the wafer/substrate surface itself. However, other patterns and pattern forming methods may be used as well. For example, dual-tone resists and interference lithography may be used.

After exposure and patterning, the resist is baked before developing (post exposure bake). The post exposure bake may also occur at temperatures of 140° C. or less, such as in the range of 70° C. to 100° C., for 10 seconds to 180 seconds. A developer, such as tetramethylammonium hydroxide TMAH (with or without surfactant) at a concentration in the range of 1.5% to 2.0% in water (IPA), is then used to remove portions of the resist 206 as illustrated in FIGS. 2c and 2d. The remaining photoresist is then, optionally, hard baked at temperature of 100° C. or greater, such as in the range of 100° C. to 300° C. for 100 s to 500 s.

Once a portion of the resist 206 is removed from selected regions 208, a series of guiding features, i.e., the trenches, 210 are created in the sacrificial hardmask 204b by etch transfer as illustrated in FIGS. 2e and 2f. As illustrated, the trenches 210 are rectangular shaped; however, other shapes are envisioned as well, such as squares, circles, ovals, etc. Etching may be accomplished using, for example, dry or plasma etching with one or more of the following etchants: $O_2$, $CF_4$, $SF_6$, $NF_3$, other etchants may be used depending on the hardmask compositions. As noted above, the etchant selected is one that provides a greater etching rate in the sacrificial hardmask 204b than in the lower hardmask 204a.

A second resist 222a, 222b is then provided within the trench 210 as illustrated in FIGS. 2g and 2h to form isolating features in the hardmask 204a. The second resist may include, for example, a self-assembling block copolymer, which segregates into two or more domains 222a, 222b within the trench 210 as described further below. While a di-block copolymer is illustrated, tri-block or other multiple block copolymers may be employed. In the case of a di-block copolymer, two different monomers are used to formulate the polymer having the following formula: -(A)m-b-(B)n-, where m and N represent the number or repeat units of A and B, respectively. Examples of di-block copolymers include, for example, poly(methyl methacrylate)/polystyrene or poly (dimethylsiloxane)/polystyrene. In embodiments, at least two of the components of the block copolymer may be immiscible and are understood to be unable to form a homogenous mixture.

Monomers for use in the block copolymers may include $C_{2-30}$ olefinic monomers, ethylene, propylene, 1-butene, 1,3-butadiene, isoprene, vinyl acetate, dihydropyran, norborene, maleic anhydride, styrene, 4-methylstyrene, or α-methylstyrene. Monomers may also include (meth)acrylate, methyl (meth)acrylate, ethyl (meth)acrylate, n-propyl (meth)acrylate, isopropyl (meth)acrylate, n-butyl (meth)acrylate, isobutyl (meth) acrylate, n-pentyl (meth)acrylate, isopentyl (meth) acrylate, neopentyl (meth)acrylate, n-hexyl (meth)acrylate, cyclohexyl (meth)acrylate, isobornyl (meth)acrylate, or hydroxyethyl (meth)acrylate. Combinations of two or more of the monomers may be used. Blocks which are homopolymers may include blocks prepared using styrene (e.g., polystyrene blocks), or (meth)acrylate homopolymeric blocks such as poly(methylmethacrylate). Random blocks may include, for example, blocks of styrene and methyl methacrylate (e.g., poly(styrene-co-methyl methacrylate)), randomly copolymerized. An alternating copolymer block might include blocks of styrene and maleic anhydride, which is known to form a styrene-maleic anhydride-diad repeating structure due to the inability of maleic anhydride to homopolymerize under most conditions (e.g., poly(styrene-alt-maleic anhydride)).

Furthermore, block copolymers that may be used herein include di-block or tri-block copolymers such as poly(styrene-b-vinyl pyridine), poly(styrene-b-butadiene), poly(styrene-b-isoprene), poly(styrene-b-methyl methacrylate), poly(styrene-b-alkenyl aromatics), poly(isoprene-b-ethylene oxide), poly(styrene-b-(ethylene-propylene)), poly(ethylene oxide-b-caprolactone), poly(butadiene-b-ethylene oxide), poly(styrene-b-t-butyl (meth)acrylate), poly(methyl methacrylate-b-t-butyl methacrylate), poly(ethylene oxide-b-propylene oxide), poly(styrene-b-tetrahydrofuran), poly(styrene-b-isoprene-b-ethylene oxide), poly(styrene-b-dimethylsiloxane), poly(methyl methacrylate-b-dimethylsiloxane), or a combination comprising at least one of the foregoing block copolymers.

In embodiments, the block copolymers exhibit a weight-averaged molecular weight ($M_w$) of 3,000 to 400,000 g/mol. Similarly, the block copolymer might have a number averaged molecular weight ($M_n$) of 1,000 to 200,000. The block copolymer might also have a polydispersity ($M_w/M_n$) of 1.01 to 6, and is not particularly limited thereto. Molecular weight, both $M_w$ and $M_n$, can be determined by, for example, gel permeation chromatography using a universal calibration method, calibrated to polystyrene standards. The assembly of the block copolymers may be directed through graphoepitaxy or chemical surface modification.

The second resist may be applied using spin coating processes, or by dip coating or spray coating and annealed at an annealing temperature in the range of 200° C. to 260° C., including all values and ranges therein such as 240° C., forcing segregation of the domains into a desired pattern. If using spin coating, spin coating may occur at 1 rpm to 100,000 rpm including all values and range therein, for a period of 1 second to 100 seconds, including all values and ranges therein. As illustrated, cylindrical domains 222b are formed by one of the domains within the trenches 210. However, in other embodiments, lines or other domain patterns may be formed. The cylindrical domains 222b are then removed as illustrated in FIGS. 2i and 2j by an appropriate etch scheme, such as by first exposing the second resist to deep ultra violet radiation (having a wavelength in the range of 248 nm to 193 nm, including all values and ranges therein) and then etching with acetic acid.

After removal of the cylindrical domain 222b, etch transfer into the underlying hardmask 204a is performed by plasma etching using, for example, $CF_4$, $F_6$, or $NF_3$, as illustrated in FIGS. 2k and 2l. Optionally, the guiding trench materials, including the sacrificial hardmask 204b and remaining block copolymer is removed such as by ashing off (or oxidizing), as illustrated in FIGS. 2m and 2n. Then, a third resist 232 is provided in the isolating features 230 formed in the hardmask 204a as illustrated in FIGS. 2o and 2p creating discrete or disconnected regions of the third resist in the hardmask. The third resist is either a positive or negative tone resist. The third resist is patterned using a technique that utilizes electromagnetic radiation having a wavelength of less than 300 nm, including all values and ranges from 1.0 pm to 250 nm, 1.0 pm to 100 nm, 1.0 pm to 50.0 nm, 1.0 pm to 20.0 nm, 13.5 nm, or less than 50 nm, etc. such as electron beam, extreme ultraviolet lithography or soft x-ray lithography. As should be appreciated the third resist may be patterned regularly or irregularly. The third resist is then developed and a portion of the third resist is removed.

The application, pre-bake, post bake, development and hard bake of the third resist occurs in a manner similar to that described above. In embodiments, in order to provide the third resist in the isolating features, the third resist is spin coated onto the hardmask and into the isolating features, wherein a layer of resist is extends across the surface of the hardmask as well as the isolating features. If the guiding features are remaining, the third resist fills the guiding features as well. In embodiments, an acid generator (such as a photoacid generator, discussed below) is deposited on the third resist or additional third resist is mixed with an excess of acid generator and deposited on top of the resist already present. The acid generator is then diffused through a portion of the third resist, particularly that portion that is present in the guiding features or across the surface of the hardmask. Diffusion is facilitated by heating. This upper portion of the third resist is developed using a developer such as TMAH and removed, wherein resist remains in the isolating features, but is removed from areas above the opening of the isolating features. Or, alternatively, or in addition to the above, just the upper portion of the third resist, above the isolating features (such as that covering the surface of the hardmask and/or within the guiding features) is exposed to light having visible UV wavelengths, grazing-incidence exposure or both to release the acid generator present in the resist near the surface. The upper portion of the third resist is developed and removed, such that third resist remains in the isolating features and is removed above the openings of the isolating features and from the hardmask surface (or from the guiding features if still remaining).

The third resist is sensitive to electron beam, extreme ultraviolet or soft x-ray lithography. In addition to chemically amplified resists, the third resist is alternatively a non-chemically amplified resist. Examples of a third resist include poly (methyl methacrylate). The third resist may require an electromagnetic radiation dose, such as an extreme ultraviolet dose, equivalent to less than 10.0 mJ/cm², including all values and ranges from 0.1 mJ/cm² up to 10.0 mJ/cm², such as 3 mJ/cm².

Furthermore, it may be appreciated that resists typically include a solvent, a resin, a photo acid generator and a quencher, which control the dose necessary to alter the solubility characteristics of the resist in a given developer. Solvents may include one or more of the following: propylene glycol monomethyl ether (PGME), propylene glycol monomethyl ether acetate (PGMEA), ethyl lactate, methyl s-hydroxybutyrate (HBM), cyclohexanone, heptanone, lactone etc. The polymer may include an acrylate, a cyclo-olefin methacrylate or a cyclo-olefin acrylate. The photo acid generator may include monophenyl sulfonium salt or triphenylsulfonium salt. The quenchers may include hydrogen chloride or water as well as compositions that include alcohols, ethyls, esters, ketones, amines such as trioctylamine, aldehydes, phenols, cyanides, flourides bromides, oxos or nitros. The polymer may be present in the range of 1% to 10% by weight of the total composition, the photo acid generator may be present in the range of 0.1% to 1.0% by weight of the total composition, the quencher may be present in the range of 0.5% to 1.0% by weight of the total composition, the remainder being solvent.

However, to better accommodate the reduced dosages described above, the third resist may be prepared by removing at least a portion, and in some embodiments all, of the quencher from the photoresist. For example, a fraction, such as half or less than half of the quencher may be present in the third resist, including all values and ranges from 0.01% to 0.5% by weight of the total composition. In employing the reduced quencher resists, the post-exposure bake is extended to up to 20 minutes, including all values and ranges from 2 minutes to 20 minutes, such as 10 minutes. Using the reduced quencher and increased bake time may allow the generated acids to thoroughly diffuse around in the resist in the entire isolated feature, deprotecting the resist polymer everywhere. Even in the case of relatively poor initial acid release in some regions, such as near the bottom of the isolated feature, due to reflected standing waves, this may enable the photoresist to completely develop in the isolated feature.

Alternatively, or in addition to the above, inorganic photoresists may be used. For example, a transition metal, such as chromium, and chalcogenide inorganic materials, such as As—S—Se glasses, and particularly $As_{40}S_{30}Se_{30}$ are employed as a mask and deposited via thermal vacuum deposition. After patterning the chalcogenide is exposed to a non-water alkaline organic solution and the transition metal was removed using a water solution of HCl through the chalcogenide mask. The silicon is then etched using ethylenediamine solutions.

As illustrated in FIGS. 2q and 2r, etch transfer into the substrate 202 is then provided forming holes 236 in the substrate where the third resist has been removed. These holes 236 form elements, such as vias or tunnels. Again, etching may be accomplished using, for example, plasma etching with the following etchants: $CF_4$, $SF_6$, $NF_3$, depending on the substrate. Substrate materials may include semiconducting material, insulating material, conductive material or combinations thereof. Substrate materials may therefore include, for example, silicon, silicon-germanium, silicon-germanium-carbon, silicon-carbon, gallium-arsenic, indium-arsenic or indium-phosphorous, polycrystalline silicon, silicon/silicon-germanium layers, silicon/silicon-carbon layers, etc.

In addition to the above, or alternatively, as illustrated in FIGS. 2s and 2t, other photosensitive compositions may be used as a third resist, such as spin-on photosensitive metal oxides (including metal oxide sulfate with a peroxo complexing agent such hafnium oxide sulfate ($HfSO_x$)) available from Inpria of Corvallis, Oreg., the above mentioned chalcogenide resists, or Si-rich photopatternable materials such as Si containing polymers including polysiloxane, polysilsequioxane, or hydrogen silsequioxane (HSQ) available form Dow Corning Corp. These compositions are also referred to herein as third resists. Similar to the third resists discussed above, these compositions may be spin-coated, pre-baked, patterned, post baked, developed and hard baked. The remaining resist 232', i.e., the resist that is not removed during the developing process, forms elements on the substrate, such as interconnects or contacts. Therefore, in embodiments, a combination of elements formed into and on the substrate may be formed using the techniques described above. In addition, the hardmask may remain to form an inter-layer dielectric.

Figure 3:
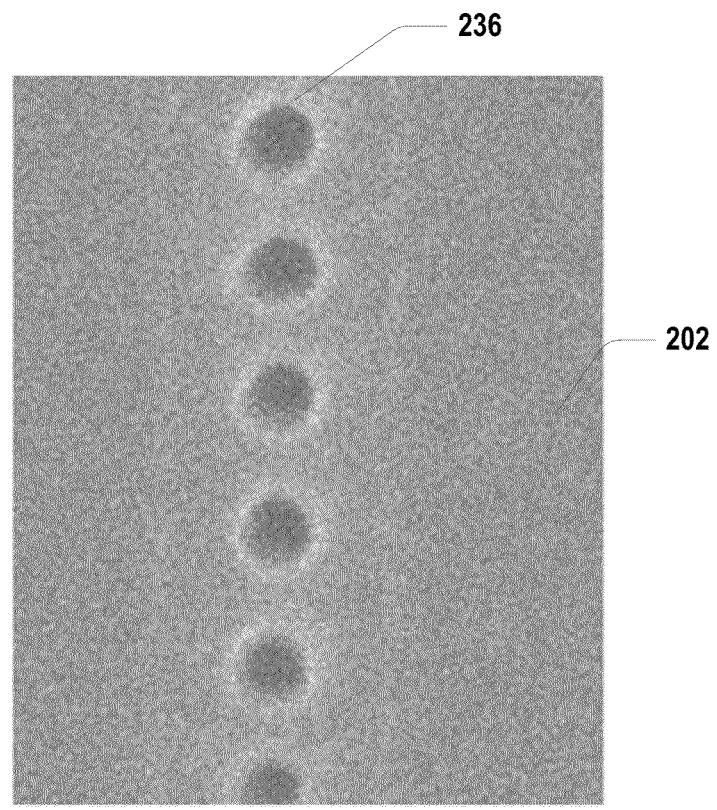
FIG. 3 illustrates an example of substrate including a number of holes formed therein using the process described in FIGS. 2a through 2p.

FIG. 3 illustrates an example of a substrate 202 produced using the process steps illustrated in FIGS. 2a through 2r. The etched holes 236 have a depth of approximately 20 nm. In addition, the etched holes 236 have an overall diameter in the range of 10-20 nm.

Figure 4A:
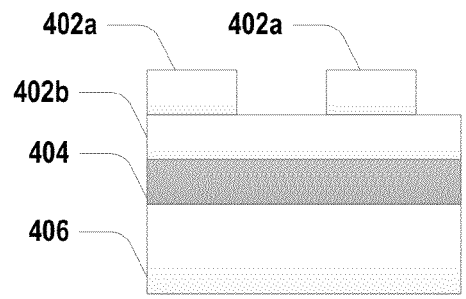
Figure 4B:
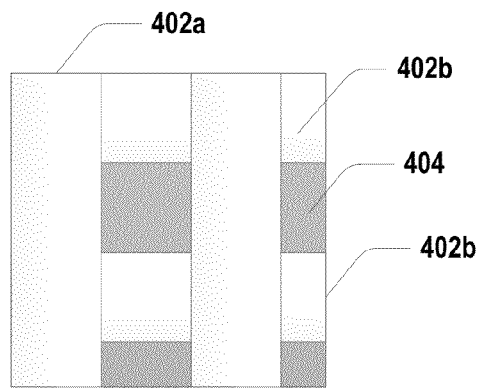

FIGS. 4a through 4l schematically illustrate another embodiment of a method of forming elements into (or onto a substrate). A crossed grating 402a, 402b (i.e., a guiding feature) is formed as illustrated in FIGS. 4a and 4b over a hardmask 404 and underlying substrate 406. The crossed-grating may be formed with one or more first resists, including, for example, poly(methyl methacrylate), poly(methyl glutarimide), DNQ/novolac, or SU-8 (an epoxy based negative resist). The resist is applied using one or more coating or casting processes, such as, but not limited to, spin coating. When using spin coating, spin coating may be performed at 1 to 10,000 rpm, including all values and ranges therein such as 3,000 to 4,000 rpm, for 1 second to 10 seconds, including all values and ranges therein.

In addition, multiple baking steps are used beginning with pre-baking after application of the resist and prior to patterning. Pre-bake may occur at temperatures of 140° C. or less, such as in the range of 70° C. to 100° C., for 60 seconds to 240 seconds. The resist is then patterned using electromagnetic radiation having one or more wavelengths of 157 nm or greater, such as 157 nm, 193 nm, 248 nm, or wavelengths up to 436 nm. Spacer-based pitch division techniques (described above) may be utilized with immersion lithography techniques (described above) to achieve features having critical dimensions of 4 nm to 100 nm, 22 nm to 50 nm, etc.

In addition to or alternatively to the above, other patterns and pattern forming methods may be used as well. For example, single direction gratings or dots may be formed having the above pitches using techniques such as employing dual-tone resists and interference lithography. In embodiments, to create elongated features, for example, parallel (or nonparallel) lines are patterned into the resist and developed to form trenches having a length to width ratio of at least 10:1, such as in the range of 10:1 to 1000:1, wherein the length to width is measured at the surface of the trench. The first resist is then deposited again and patterned so as to break up the length of the trenches into a number of elongated and rectangular guiding features.

After exposure and patterning, the resist is baked before developing (post exposure bake). The post exposure bake may also occur at temperatures of 140° C. or less, such as in the range of 70° C. to 100° C., for 10 seconds to 180 seconds. A developer, such as tetramethylammonium hydroxide TMAH (with or without surfactant), at a concentration of 1.5% to 2.5% by volume in water, is then used to remove portions of the resist creating guiding features 407 in the resist. The photoresist is then, optionally, hard baked at temperature of 100° C. or greater, such as in the range of 100° C. to 300° C. for 100 s to 500 s.

Figure 4C:
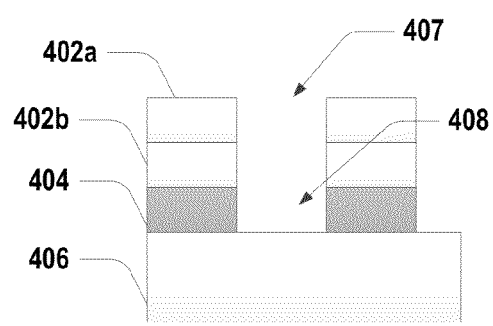
Figure 4D:
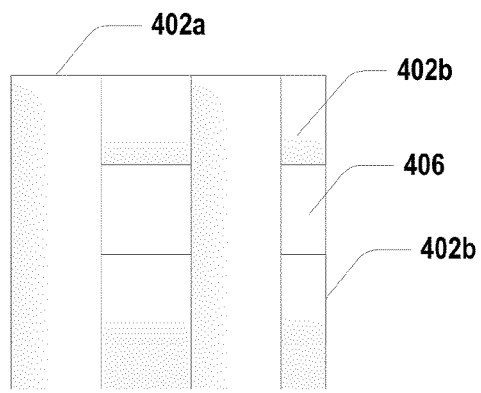

Once the cross-gratings are formed, a series of isolating features, illustrated as holes, 408 are created in the hardmask 404 by etch transfer as illustrated in FIGS. 4c and 4d. As illustrated, the holes are square shaped; however, other shapes are envisioned as well, such as rectangles, circles, ovals, etc. Etching may be accomplished using, for example, plasma etching with the following etchants: $CF_4$, $SF_6$, $NF_3$, depending on the hardmask compositions. Hardmask compositions may include, for example, nitrides (such as TiN, SiN) or polymer spin coats (such as spin on carbon) as well as photodefinable polymers (such as photodefinable polyimides, photodefinable benzocyclobutene, photodefinable fluorocarbons polymers and photodefinable epoxies).

Figure 4E:
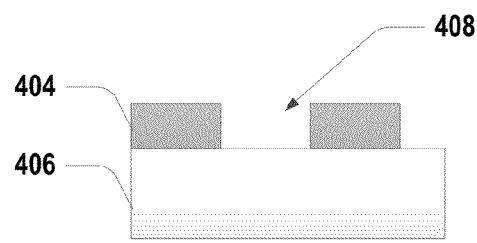
Figure 4F:
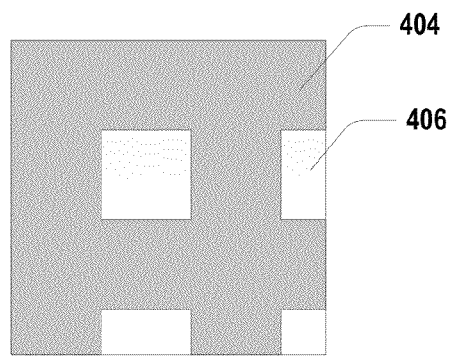
Figure 4G:
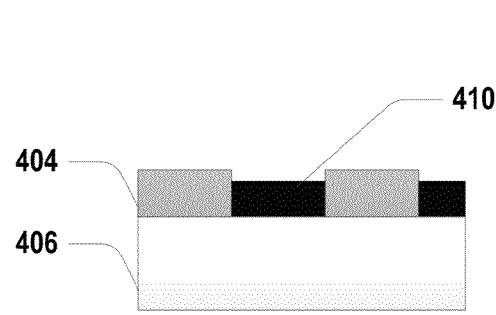
Figure 4H:
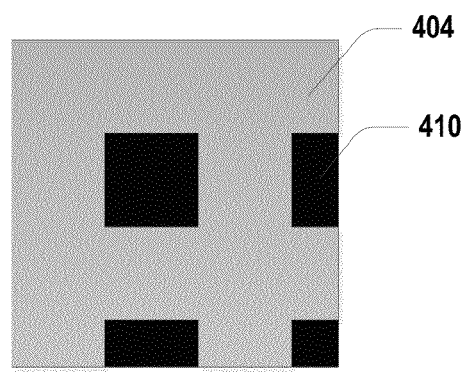

As illustrated in FIGS. 4e and 4f, the guiding materials, i.e., the cross-gratings are removed exposing the surface of the hardmask 404. In embodiments, the cross-gratings are ashed off via oxidation. However, in some embodiments, the cross-gratings (or other first resist) 402 may be kept to form interlayer dielectrics. The isolating features 408 are then filed with a second resist 410, as illustrated in FIGS. 4g and 4h, to create discrete regions of the second photoresist 410 within the hardmask 404.

The process of applying the second resist is similar to that of the first resist, including spin coating, pre-baking, exposing, post-exposure bake, developing and, optionally, hard baking. In embodiments, in order to provide the second resist in the isolating features, the second resist is spin coated onto the hardmask and into the isolating features, wherein a layer of resist is extends across the surface of the hardmask as well as the isolating features. If the guiding features are remaining, the second resist fills the guiding features as well. An acid generator (such as a photoacid generator, discussed below) is deposited on the second resist. In embodiments, additional second resist is mixed with an excess of acid generator and deposited on top of the resist already present. The acid generator is then diffused through a portion of the second resist, particularly that portion that is present in the guiding features or across the surface of the hardmask. Diffusion is facilitated by heating. This upper portion of the second resist is developed using a developer such as TMAH and removed, wherein resist remains in the isolating features, but is removed from areas above the opening of the isolating features. Or, alternatively, or in addition to the above, just the upper portion of the second resist, above the isolating features (such as that covering the surface of the hardmask and/or within the guiding features) is exposed to light having visible UV wavelengths, grazing-incidence exposure or both to release the acid generator present in the resist near the surface. This portion of the second resist is developed and removed, such that second resist remains in the isolating features and is removed above the openings of the isolating features and from the hardmask surface (or from the guiding features if still remaining).

In addition to chemically amplified resists, non-chemically amplified resists are alternatively used. In embodiments, the resists being sensitive to patterning processes utilizing a wavelength of less than 300 nm, including all values and ranges from 1.0 pm to 250 nm, 1.0 pm to 250 nm, 1.0 pm to 50.0 nm, 1.0 pm to 20.0 nm, 13.5 nm, etc., such as poly (methyl methacrylate) or copolymers thereof, including those compositions utilized as the third resist described above. Patterning processes therefore include extreme ultraviolet, electron beam or soft x-ray radiation. In addition, the wavelength for patterning the isolating features is smaller than that used for patterning the guiding features. The second resist may be a positive tone or a negative tone resist. Examples of a second resist include poly(methyl methacrylate). The second resist requires a dose, such as an extreme ultraviolet dose or electron beam dose, equivalent to less than 10.0 mJ/cm$^2$, including all values and ranges from 0.1 mJ/cm$^2$ up to 10.0 mJ/cm$^2$, such as 3.0 mJ/cm$^2$. The dose for patterning the isolating features is less than the dose for patterning the guiding features.

Furthermore, it may be appreciated that resists typically include a solvent, a resin, a photo acid generator and a quencher, which control the dose necessary to alter the solubility characteristics of the resist in a given developer. Solvents may include one or more of the following: propylene glycol monomethyl ether (PGME), propylene glycol monomethyl ether acetate (PGMEA), ethyl lactate, methyl s-hydroxybutyrate (HBM), cyclohexanone, heptanone, lactone etc. The polymer may include an acrylate, a cyclo-olefin methacrylate or a cyclo-olefin acrylate. The photo acid generator may include monophenyl sulfonium salt or triphenylsulfonium salt. The quenchers may include hydrogen chloride or water as well as compositions that include alcohols, ethyls, esters, ketones, amines such as trioctylamine, aldehydes, phenols, cyanides, flourides bromides, oxos or nitros. The polymer may be present in the range of 1% to 10% by weight of the total composition, the photo acid generator may be present in the range of 0.1% to 1.0% by weight of the total composition, the quencher may be present in the range of 0.5% to 1.0% by weight of the total composition, the remainder being solvent.

However, to better accommodate the reduced dosages described above, the third resist may be prepared by removing at least a portion of the quencher from the photoresist. For example, a fraction, such as half or less than half of the quencher may be present in the third resist, including all values and ranges from 0.01% to 0.50% by weight of the total composition. In employing the reduced quencher resists, the post-exposure bake is extended to up to 20 minutes, including all values and ranges from 2 minutes to 20 minutes, such as 10 minutes. Using the reduced quencher and increased bake time may allow the generated acids to thoroughly diffuse around in the resist in the entire isolated feature, deprotecting the resist polymer everywhere. Even in the case of relatively poor initial acid release in some regions, such as near the bottom of the isolated feature, due to reflected standing waves, this may enable the photoresist to completely develop in the isolated feature.

Alternatively, or in addition to the above, inorganic photoresists may be used. For example, a transition metal, such as chromium, and chalcogenide inorganic materials, such as As—S—Se glasses, and particularly $As_{40}S_{30}Se_{30}$ are employed as a mask and deposited via thermal vacuum deposition. After patterning the chalcogenide is exposed to a non-water alkaline organic solution and the transition metal was removed using a water solution of HCl through the chalcogenide mask. The silicon is then etched using ethylenediamine solutions.

Figure 4I:
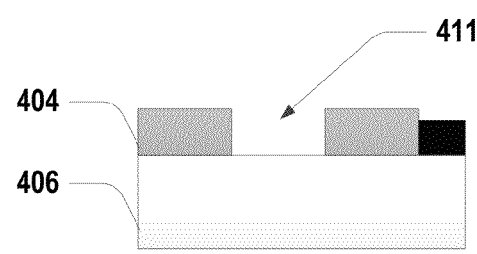
Figure 4J:
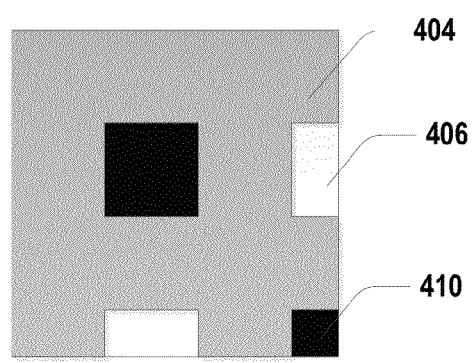
Figure 4K:
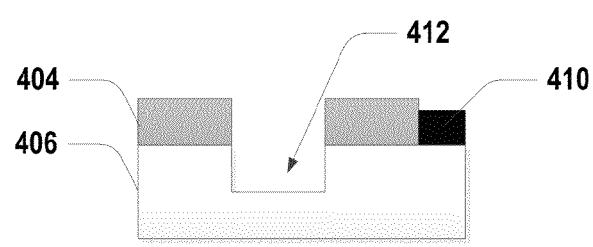
Figure 4L:
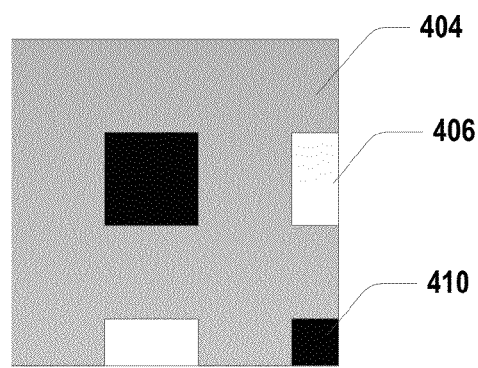

As illustrated in FIGS. 4i and 4j, the second resist 410 is selectively patterned. As alluded to above, the second resist 410 is patterned to form regular elements, irregular elements (or a combination thereof) using extreme ultraviolet lithography, electron beam lithography or soft x-ray lithography.

After removing selected regions of the resist 411, the pattern is etch transferred, in a manner as described in any of the above embodiments, into the underlying substrate 406 as illustrated in FIGS. 4g and 4h, forming holes 412 in the substrate 406, where the resist has been removed. These holes form elements, such as vias. Again, etching may be accomplished using, for example, plasma etching with the following etchants: $CF_4$, $SF_6$, $NF_3$, depending on the substrate. Substrate materials may include semiconducting material, insulating material, conductive material or combinations thereof. Substrate materials may therefore include, for example, silicon, silicon-germanium, silicon-germanium-carbon, silicon-carbon, gallium-arsenic, indium-arsenic or indium-phosphorous, polycrystalline silicon, silicon/silicon-germanium layers, silicon/silicon-carbon layers, etc.

In addition to the above, or alternatively, other photosensitive compositions may be used such as spin-on photosensitive metal oxides (including metal oxide sulfate with a peroxo complexing agent such halfnium oxide sulfate ($HfSO_x$)) available from Inpria of Corvallis, Oreg., chalcogenide inorganic photoresists (such as As—A—Se glasses), Si-rich photopatternable materials such as Si containing polymers including polysiloxane, polysilsequioxane, or hydrogen silsequioxane (HSQ) available form Dow Corning Corp. These compositions are also referred to herein as second resists. Similar to the resist discussed above, these compositions may be spin-coated, pre-baked, patterned, post baked, developed and hard baked. The remaining resist, i.e., the resist that is not removed during the developing process, forms elements on the substrate, such as interconnects or contacts. Therefore, in embodiments, a combination of elements formed into and on the substrate may be formed using the techniques described above.

Accordingly, in any aspect, the present application is directed to a method of fabricating a substrate. The method includes coating a first resist onto a hardmask, exposing regions of the first resist to electromagnetic radiation at a dose of 10.0 $mJ/cm^2$ or greater, and removing a portion of the resist and forming guiding features. The method also includes etching the hardmask forming isolating features in the hardmask, applying a second resist within the isolating features forming regions of the second resist in the hardmask, and exposing regions of the second resist to electromagnetic radiation having a dose of less than 10.0 $mJ/cm^2$ and forming elements.

In embodiments of the above, the hardmask includes a sacrificial hardmask and an underlying hardmask, wherein the guiding features are formed in the sacrificial hardmask and the isolating features are formed in the underlying hardmask. In particular embodiments of the above, the underlying hardmask exhibits a greater first etch resistance than a second etch resistance exhibited by said sacrificial hardmask to an etchant.

Further, in any of the above embodiments, the isolating features are formed in said underlying hardmask by depositing a self-assembling block copolymer into said guiding features, annealing said self-assembling block copolymer to form at least two domains, removing one of said domains, and etching into said underlying hardmask. In addition, in the above embodiment, the method further includes removing the first resist, the sacrificial hardmask and the self-assembling block copolymer, after forming the isolating features in the underlying hardmask. In any of the above embodiments, self-assembling block copolymer includes at least two immiscible components. In particular embodiments, the self-assembling block copolymer comprises a di-block copolymer and, in more particular embodiments the self-assembling block copolymer comprises poly(methyl methacrylate) and polystyrene.

Alternatively, in addition to the above embodiments, guiding features are formed in the first resist.

In any of the above embodiments, the guiding features are formed using spacer-based pitch division. In addition, in any of the above embodiments, the guiding features are cross-gratings. Further, in any of the above embodiments, the first resist is removed after forming said isolating features in said hardmask. In addition, in any of the above embodiments, the second resist includes a quencher present in the range of 0.01% by weight to 0.5% by weight of the total resist composition.

In any of the above embodiments, the elements are formed in a substrate underlying the hardmask by removing at least a portion of the second resist from the isolated features and etching the substrate. Alternatively, or in addition, the second resist includes one or more of the following: photosensitive metal oxide, a silicon containing polymer, and chalcogenides; and wherein said elements are formed on a substrate underlying said hardmask.

In any of the above embodiments, the elements exhibit a critical dimension in the range of 4 nm to 100 nm. In any of the above embodiments, the elements exhibit a critical dimension in the range of 4 nm to 100 nm and preferably in the range of 4 nm to 100 nm and more preferably in the range of 4 nm to 50 nm and more preferably in the range of 4 nm to 30 nm.

In addition, in any of the above embodiments, the hardmask comprises an antireflective layer. Further, in any of the above embodiments, the antireflective layer includes silicon. Also, in any of the above embodiments where a sacrificial and underlying hardmask are present, the sacrificial hardmask comprises spin on carbon and the underlying hardmask comprises one or more of the following: oxides and carbides. Further, in any of the above embodiments where a sacrificial and underlying hardmask are present, the underlying hardmask exhibits a first etch resistance and said sacrificial hardmask exhibits a second etch resistance and said first etch resistance is greater than said second etch resistance.

In any of the above embodiments, the first resist is patterned using immersion photolithography.

In any of the above embodiments, the isolating features have an elongated geometry and are formed by forming guiding features with a length to width ratio of at least 10:1; depositing a the first resist in the guiding features; pattaring the first resist to divide the guiding features along the length of the guiding features; developing and removing said first resist.

Further in any of the above embodiments, applying said second resist comprises depositing the second resist over the hardmask and the isolating features; deposit acid generator on the second resist; diffuse acid into an upper portion of the second resist over the hardmask; develop the upper portion of the second resist; remove the upper portion of the second resist in the guiding features, wherein the second resist remains in said isolating features.

Alternatively, or in addition, in any of the above embodiments, applying the second resist comprises depositing the second resist over said hardmask and in the isolating features; exposing an upper portion of the second resist; developing and removing the upper portion of the second resist, wherein the second resist remains in the isolating features.

In any of the above embodiments, the second resist is patterned by one of the following techniques: electron beam lithography, extreme ultraviolet lithography, soft x-ray lithography and 193 nm wavelength photolithography. In addition, in any of the above embodiments, the first resist is exposed to electromagnetic radiation having one or more wavelengths of 157 nm or greater and the second resist is exposed to electromagnetic radiation having a wavelength of less than 300 nm, wherein the second wavelength is less than the first wavelength. In particular embodiments of the above, the first resist is exposed to electromagnetic radiation having one or more wavelengths of 157 nm to 436 nm and said second resist is exposed to electromagnetic radiation having a wavelength of 1.0 pm to 250 nm, wherein said second wavelength is less than said first wavelength. In particular embodiments of the above, the first resist is exposed to electromagnetic radiation having a wavelength of 193 nm and said second resist is exposed to electromagnetic radiation having a wavelength of 13.5 nm. Accordingly, in any of the above embodiments, the first resist is exposed to electromagnetic radiation having a wavelength of greater than 157 nm and preferably in the range of 157 nm to 436 nm and more preferably in the range of 157 nm to 250 nm and more preferably 193 nm and the second resist is exposed to electromagnetic radiation having a wavelength in the range of 1.0 pm to 250 nm and more preferably in the range of 1.0 pm to 50 nm and more preferably in the range of 1.0 pm to 20 nm and more preferably 13.5 nm.

In yet a further aspect of the present disclosure a method is provided for fabricating a substrate. The method may include coating a first resist onto a hardmask, exposing regions of said first resist to electromagnetic radiation having one or more wavelengths of 157 nm or greater, and removing a portion of said resist and forming guiding features. The method also includes etching the hardmask forming isolating features in the hardmask, applying a second resist within the isolating features forming regions of the second resist in said hardmask, and exposing regions of the second resist to electromagnetic radiation having a wavelength of less than 50 nm and forming elements.

In embodiments of the above, the hardmask includes a sacrificial hardmask and an underlying hardmask, wherein the guiding features are formed in the sacrificial hardmask and the isolating features are formed in the underlying hardmask. In particular embodiments of the above, the underlying hardmask exhibits a greater first etch resistance than a second etch resistance exhibited by said sacrificial hardmask to an etchant.

Further, in any of the above embodiments, the isolating features are formed in said underlying hardmask by depositing a self-assembling block copolymer into said guiding features, annealing said self-assembling block copolymer to form at least two domains, removing one of said domains, and etching into said underlying hardmask. In addition, in the above embodiment, the method further includes removing the first resist, the sacrificial hardmask and the self-assembling block copolymer, after forming the isolating features in the underlying hardmask. In any of the above embodiments, self-assembling block copolymer includes at least two immiscible components. In particular embodiments, the self-assembling block copolymer comprises a di-block copolymer and, in more particular embodiments the self-assembling block copolymer comprises poly(methyl methacrylate) and polystyrene.

Alternatively, in addition to the above embodiments, guiding features are formed in the first resist.

In any of the above embodiments, the guiding features are formed using spacer-based pitch division. In addition, in any of the above embodiments, the guiding features are cross-gratings. Further, in any of the above embodiments, the first resist is removed after forming said isolating features in said hardmask. In addition, in any of the above embodiments, the second resist includes a quencher present in the range of 0.01% by weight to 0.5% by weight of the total resist composition.

In any of the above embodiments, the elements are formed in a substrate underlying the hardmask by removing at least a portion of the second resist from the isolated features and etching the substrate. Alternatively, or in addition, the second resist includes one or more of the following: photosensitive metal oxide, a silicon containing polymer, and chalcogenides; and wherein said elements are formed on a substrate underlying said hardmask.

In any of the above embodiments, the elements exhibit a critical dimension in the range of 4 nm to 100 nm. In any of the above embodiments, the elements exhibit a critical dimension in the range of 4 nm to 100 nm and preferably in the range of 4 nm to 100 nm and more preferably in the range of 4 nm to 50 nm and more preferably in the range of 4 nm to 30 nm.

In addition, in any of the above embodiments, the hardmask comprises an antireflective layer. Further, in any of the above embodiments, the antireflective layer includes silicon. Also, in any of the above embodiments where a sacrificial and underlying hardmask are present, the sacrificial hardmask comprises spin on carbon and the underlying hardmask comprises one or more of the following: oxides and carbides. Further, in any of the above embodiments where a sacrificial and underlying hardmask are present, the underlying hardmask exhibits a first etch resistance and said sacrificial hardmask exhibits a second etch resistance and said first etch resistance is greater than said second etch resistance.

In any of the above embodiments, the first resist is patterned using immersion photolithography.

In any of the above embodiments, the isolating features have an elongated geometry and are formed by forming guiding features with a length to width ratio of at least 10:1; depositing a the first resist in the guiding features; pattering the first resist to divide the guiding features along the length of the guiding features; developing and removing said first resist.

Further in any of the above embodiments, applying said second resist comprises depositing the second resist over the hardmask and the isolating features; deposit acid generator on the second resist; diffuse acid into an upper portion of the second resist over the hardmask; develop the upper portion of the second resist; remove the upper portion of the second resist in the guiding features, wherein the second resist remains in said isolating features.

Alternatively, or in addition, in any of the above embodiments, applying the second resist comprises depositing the second resist over said hardmask and in the isolating features; exposing an upper portion of the second resist; developing and removing the upper portion of the second resist, wherein the second resist remains in the isolating features.

In any of the above embodiments, the second resist is patterned by one of the following techniques: electron beam lithography, extreme ultraviolet lithography, soft x-ray lithography and 193 nm wavelength photolithography. In addition, in any of the above embodiments, the first resist is exposed to electromagnetic radiation having one or more wavelengths of 157 nm to 436 nm and said second resist is exposed to electromagnetic radiation having a wavelength of 1.0 pm to 250 nm, wherein said second wavelength is less than said first wavelength. In particular embodiments of the above, the first resist is exposed to electromagnetic radiation having a wavelength of 193 nm and said second resist is exposed to electromagnetic radiation having a wavelength of 13.5 nm. Accordingly, in any of the above embodiments, the first resist is exposed to electromagnetic radiation having a wavelength of in the range of 157 nm to 436 nm and more preferably in the range of 157 nm to 250 nm and more preferably 193 nm and the second resist is exposed to electromagnetic radiation having a wavelength in the range of 1.0 pm to 250 nm and more preferably in the range of 1.0 pm to 50 nm and more preferably in the range of 1.0 pm to 20 nm and more preferably 13.5 nm.

The foregoing description of several methods and embodiments has been presented for purposes of illustration. It is not intended to be exhaustive or to limit the claims to the precise steps and/or forms disclosed, and obviously many modifications and variations are possible in light of the above teaching. It is intended that the scope of the invention be defined by the claims appended hereto.

What is claimed is:

1. An intermediate for use in a method of fabricating a substrate, comprising:
    a substrate;
    a hardmask layer on said substrate; and
    a cross grating formed on said hardmask layer, said cross grating comprising a first patterned layer and a second patterned layer;
    wherein:
        said first patterned layer is present on said hardmask layer;
        said second patterned layer is on said first patterned layer; and
        said first and second patterned layers intersect to form regions in which least a portion of said hardmask layer is exposed.

2. The intermediate of claim 1, wherein said first and second patterned layers are formed from the same or different materials.

3. The intermediate of claim 1, further comprising isolating features formed within at least a portion of said regions.

4. The intermediate of claim 3, wherein said isolating features comprise holes formed in said hardmask layer.

5. The intermediate of claim 3, wherein said isolating features are filled with a resist material so as to form discrete regions of the resist material within the hardmask layer.

6. The intermediate of claim 5, wherein said resist material extends across a surface of said hardmask layer and said isolating features.

7. The intermediate of claim 5, further comprising an acid generator diffused into said resist material.

8. The intermediate of claim 7, wherein said resist material is a chemically amplified resist.

9. The intermediate of claim 5, wherein said resist material is a non-chemically amplified resist.

10. The intermediate of claim 5, wherein at least a portion of said cross grating has been removed.

11. The intermediate of claim 5, wherein selected regions of said resist material have been removed.

12. The intermediate of claim 11, wherein a pattern is formed by the selected regions in which the resist material has been removed.

13. The intermediate of claim 12, wherein the pattern has been transferred to the substrate.

14. The intermediate of claim 13, further comprising holes within regions of the substrate corresponding to said selected regions in which the second resist has been removed.

15. The intermediate of claim 14, wherein said holes form elements within said substrate.

16. The intermediate of claim 15, wherein said elements comprise one or more vias.

17. The intermediate of claim 14, wherein said elements have a quadrilateral profile in a top down view thereof.

18. The intermediate of claim 17, wherein said elements have a round profile in a top down view thereof.

19. The intermediate of claim 1, wherein said first patterned layer, said second patterned layer, or a combination thereof was manufactured using using spacer based pitch division.

20. The intermediate of claim 19, wherein both said first patterned layer and said second patterned layer were manufactured using spacer based pitch division.

* * * * *